United States Patent
Walsh et al.

(10) Patent No.: US 11,531,424 B2
(45) Date of Patent: Dec. 20, 2022

(54) NANO-POWER CAPACITANCE-TO-DIGITAL CONVERTER

(71) Applicant: Cypress Semiconductor Corporation, San Jose, CA (US)

(72) Inventors: Paul M. Walsh, Cork (IE); Dermot MacSweeney, Cork (IE); Said Hussaini, Delft (NL); Hui Jiang, Delft (NL); Kofi Makinwa, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/938,976

(22) Filed: Mar. 28, 2018

(65) Prior Publication Data

US 2019/0072597 A1   Mar. 7, 2019

Related U.S. Application Data

(60) Provisional application No. 62/585,043, filed on Nov. 13, 2017, provisional application No. 62/555,504, filed on Sep. 7, 2017.

(51) Int. Cl.

| | |
|---|---|
| *G06F 3/041* | (2006.01) |
| *G01R 27/26* | (2006.01) |
| *H03M 1/12* | (2006.01) |
| *G06F 3/044* | (2006.01) |
| *H03M 1/14* | (2006.01) |
| *H03M 1/48* | (2006.01) |
| *G01D 5/24* | (2006.01) |

(52) U.S. Cl.
CPC ... *G06F 3/041661* (2019.05); *G01R 27/2605* (2013.01); *G06F 3/044* (2013.01); *H03M 1/12* (2013.01); *H03M 1/14* (2013.01); *H03M 1/48* (2013.01); *G01D 5/24* (2013.01)

(58) Field of Classification Search
CPC ............. G01R 27/2605; G06F 3/044; G06F 3/041661; H03M 1/12; G01D 5/24
USPC ................................ 324/658–690
See application file for complete search history.

(56) References Cited

U.S. PATENT DOCUMENTS 5,461,321 A * 10/1995 Sanders ............ G01R 27/2605
                                                    324/678
6,549,155 B1    4/2003 Heminger et al.
(Continued)

FOREIGN PATENT DOCUMENTS

| CN | 106921391 A | 7/2017 |
|---|---|---|
| WO | 2014036532 A1 | 3/2014 |
| WO | 2017046782 A1 | 3/2017 |

OTHER PUBLICATIONS

N. Madhu Mohan, et al., Digital Converter for Differential Capacitive Sensors, IEEE Transactions on Instrumentation and Measurement, vol. 57, No. 11, Nov. 2008; 6 pages.

(Continued)

*Primary Examiner* — Jeff W Natalini

(57) ABSTRACT

An asynchronous capacitance-to-digital converter (CDC) is described that allows for very low-power operation when during inactive periods (when no conductive object is in contact or proximity to the sensing electrodes). Asynchronous operation of the CDC provides for capacitance-to-digital conversion without the use of system resources and more power intensive circuit elements.

6 Claims, 10 Drawing Sheets

(56) References Cited

U.S. PATENT DOCUMENTS

| | | | |
|---|---|---|---|
| 8,410,969 B2* | 4/2013 | Krauss | H03M 1/60 341/143 |
| 8,754,360 B2* | 6/2014 | van Geloven | G06F 3/0338 250/221 |
| 9,026,059 B2 | 5/2015 | Shi et al. | |
| 9,128,570 B2 | 9/2015 | Vallis et al. | |
| 9,164,137 B2 | 10/2015 | Page et al. | |
| 9,438,261 B2 | 9/2016 | Gonzalez et al. | |
| 9,639,733 B2 | 5/2017 | Kremin et al. | |
| 9,684,418 B1 | 6/2017 | Hills et al. | |
| 2005/0194970 A1* | 9/2005 | Scheller | G01V 3/081 324/207.26 |
| 2007/0007971 A1* | 1/2007 | Takekawa | G01R 27/2605 324/662 |
| 2009/0153383 A1* | 6/2009 | Zebedee | H03M 1/1061 341/150 |
| 2010/0079401 A1 | 4/2010 | Staton | |
| 2011/0234433 A1 | 9/2011 | Aruga et al. | |
| 2012/0043970 A1 | 2/2012 | Olson | |
| 2012/0054379 A1 | 3/2012 | Leung et al. | |
| 2012/0146668 A1 | 6/2012 | Satake et al. | |
| 2012/0306802 A1 | 12/2012 | McCracken | |
| 2014/0347310 A1 | 11/2014 | Hargreaves | |
| 2015/0295587 A1* | 10/2015 | Garcia Gonzalez | H03M 3/356 341/121 |
| 2017/0205453 A1* | 7/2017 | Bharathan | G01R 27/2605 |

OTHER PUBLICATIONS

International Search Report for International Application No. PCT/US2018/046094 dated Nov. 26, 2018, 4 pages.

Written Opinion of the International Searching Authority for International Application No. PCT/US2018/046094 dated Nov. 26, 2018, 6 pages.

* cited by examiner

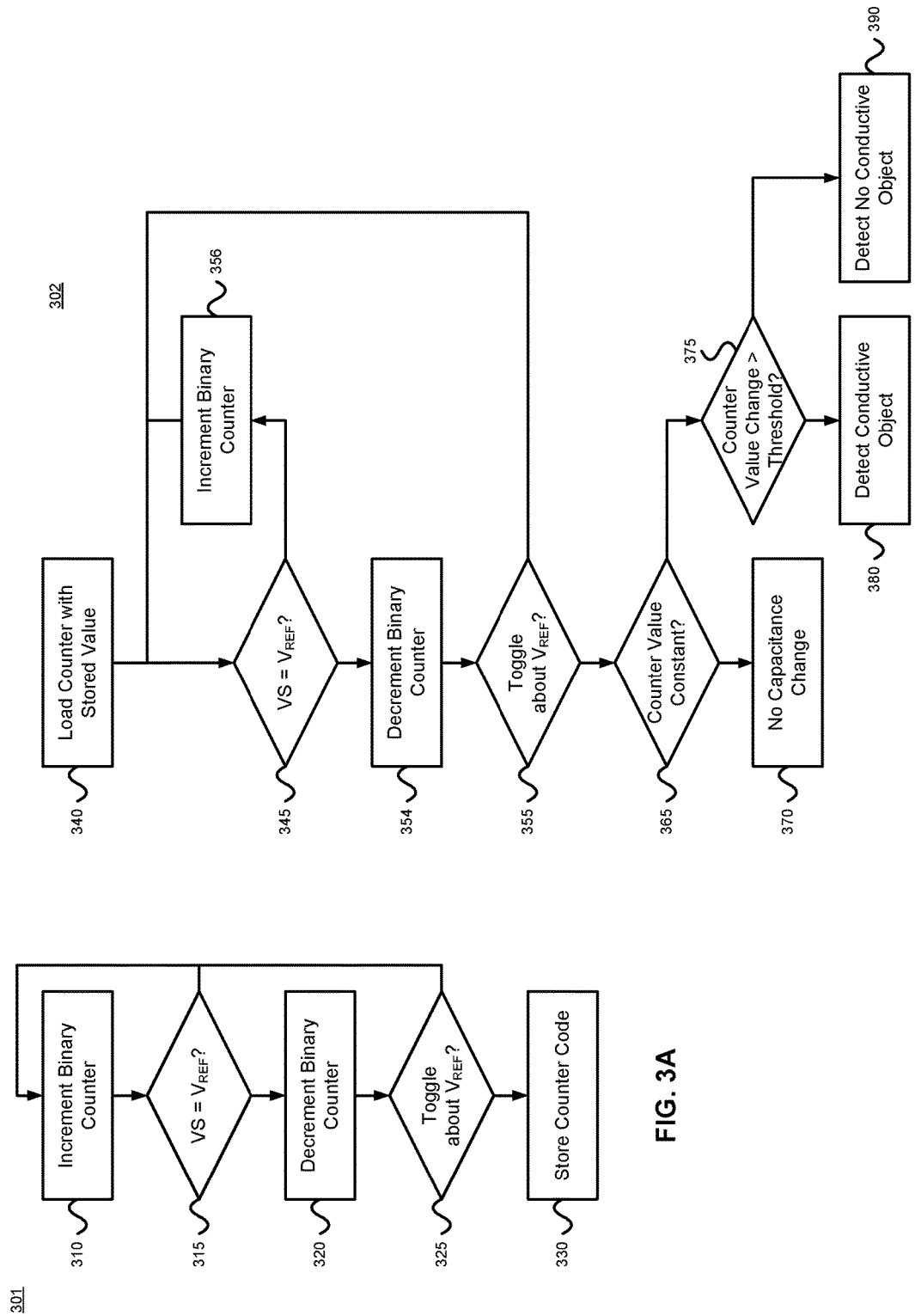

NANO-POWER CAPACITANCE-TO-DIGITAL CONVERTER

RELATED APPLICATIONS

This patent application claims the benefit of U.S. Provisional Patent Application Nos. 62/555,504, filed Sep. 7, 2017, and 62/585,043, filed Nov. 13, 2017, which are incorporated by reference herein in their entirety.

TECHNICAL FIELD

The present disclosure relates generally electrical characteristics sensing, and more particularly sensing capacitance variations.

BACKGROUND

Computing devices, such as notebook computers, personal data assistants (PDAs), kiosks, and mobile handsets, have user interface devices, which are also known as human interface devices (HID). One type of user interface device is a touch-sensor pad (also commonly referred to as a touchpad), which can be used to emulate the function of a personal computer (PC) mouse. A touch-sensor pad replicates mouse X/Y movement by using two defined axes which contain a collection of sensor electrodes that detect the position of one or more objects, such as a finger or stylus. The touch-sensor pad provides a user interface device for performing such functions as positioning a pointer, or selecting an item on a display. Another type of user interface device is a touch screen. Touch screens, also known as touchscreens, touch windows, touch panels, or touchscreen panels, are transparent display overlays that allow a display to be used as an input device, removing the keyboard and/or the mouse as the primary input device for interacting with the display's content. Other user interface devices include buttons, sliders, etc., which can be used to detect touches, taps, drags, and other gestures.

Capacitance sensing systems are increasingly used for implementing these and other types of user interface devices, and function by sensing electrical signals generated on electrodes that reflect changes in capacitance. Such changes in capacitance can indicate a touch event or the presence of a conductive object, such as a finger, near the electrodes. The capacitance changes of the sensing electrodes can then be measured by an electrical circuit that converts the capacitances measured from the capacitive sense elements into digital values to be interpreted by a host device. Sensing circuits and the control and processing circuits that enable them may consume more power and take more time than some applications can afford. A fast, low-power sensing method is therefore desired.

DESCRIPTION OF THE DRAWINGS

FIG. 3A illustrates a method of determining a digital code representative of a capacitance, according to one embodiment.

FIG. 3B illustrates, a method of detecting a presence or proximity of a conductive object on a sensing electrode based on a digital conversion, according to one embodiment.

Figure 1:
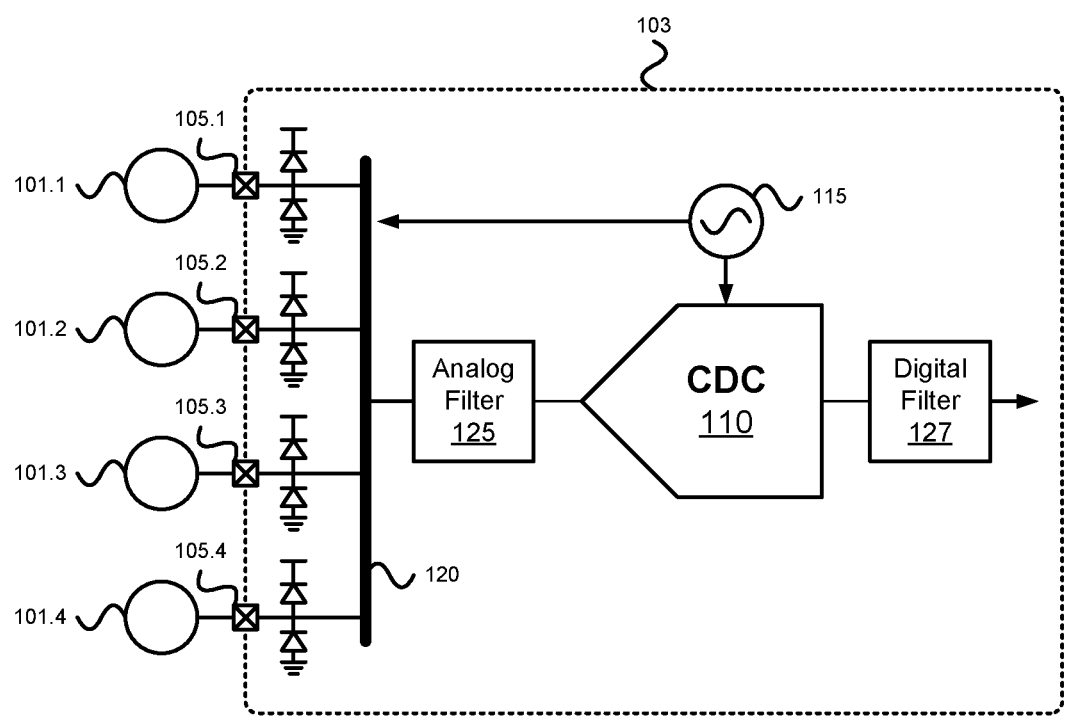
FIG. 1 illustrates a capacitance measurement system, according to one embodiment.

The features and advantages of embodiments of the present invention will become more apparent from the detailed description set forth below when taken in conjunction with the drawings. In the drawings, like reference numbers generally indicate identical, functionally similar, and/or structurally similar elements.

SUMMARY

A first embodiment of the present invention may be a CDC including a comparator coupled to a sensing electrode and to a reference signal. A capacitive digital-to-analog converter (DAC) may be coupled to the sensing electrode and to the input of the comparator and controlled by a counter coupled to the output of the comparator through a logic circuit. In this embodiment, capacitance change may be detected by a processing circuit by comparing values of the counter from one time to another.

A second embodiment of the present invention may be a CDC including a comparator coupled to a pair of sensing electrodes or other similar inputs. A pair of capacitive DAC may be coupled to the sensing electrode or similar inputs and to the corresponding inputs of the comparator and controlled by a counter coupled to the output of the comparator through a logic circuit. The capacitive DACs may be controlled by complimentary signals. In this embodiment, capacitance change may be detected by a processing circuit by comparing values of the counter from one time to another.

A third embodiment of the present invention may be a method of detecting a change of capacitance on a sensing electrode by first applying a signal to the sensing electrode and then comparing the signal to a reference signal. The applied signal may the be incremented or decremented based on the comparison until a toggle condition is reached, at which time a counter value associated with the signal at which the toggle condition is reached is stored.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

FIG. 1 illustrates a capacitive sensing system 100 for detecting the presence of a conductive object on or in proximity to sensing electrodes 101.1-101.4. Capacitive sensing system 100 may include circuit 103 including a capacitance-to-digital converter (CDC) 110 which may be triggered or enabled by timer 115, which may also provide clocking and/or control signals to multiplexer 120. Multiplexer 120 may be coupled to an input of CDC 110 through analog filter 125 and to input/outputs (I/Os) 105.1-105.4 of a circuit 103. IOs 105.1-105.4 may be coupled to sensing electrodes 101.1-101.4, such that sensing electrodes 101.1-101.4 are coupled to CDC 110 though IOs 105.1-105.4, multiplexer 120, and analog filter 125. The output of CDC 110 may be coupled to digital filter 127. In various embodiments, analog filter 125 and digital filter 127 may be used to reduce the frequency of false touch or proximity events that may be caused by environmental noise, human body noise, or other system interference. The output of digital filter 127 may be coupled to a processing circuit (not shown) for processing the output of CDC 110.

While four sensing electrodes are illustrated in FIG. 1, more or fewer sensing electrodes may be implemented depending on application requirements. Additionally, while the embodiment of capacitance sensing system 100 illustrates a single CDC for all of the sensing electrodes, different numbers of CDCs may be implemented. In one embodiment, a CDC may be implemented for each sensing electrode. In another embodiment, sensing electrodes may be grouped together and correspond to one of a plurality of CDCs that may be configured to operate simultaneously.

Figure 2:
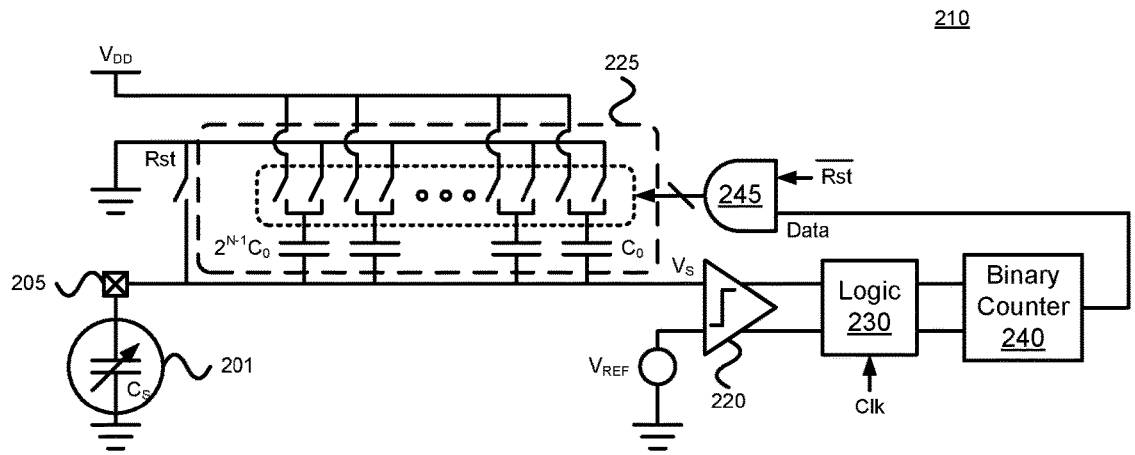
FIG. 2 illustrates a single-ended asynchronous capacitance-to-digital converter (CDC), according to one embodiment.

FIG. 2 illustrates CDC 110 of FIG. 1 in a single-ended asynchronous configuration 210 (hereafter referred to as CDC 210). CDC 210 may include a comparator 220 having an input coupled to a reference voltage ($V_{REF}$) and another input coupled to sensing electrode 201 having a capacitance, $C_S$. Sensing electrode 201 may correspond to sensing electrodes 101.1-101.4 of FIG. 1. In one embodiment, sensing electrode 201 may be coupled to CDC 210 through I/O 205 as described in FIG. 1. The input of comparator 220 coupled to sensing electrode 201 may also be coupled to a capacitive digital-to-analog converter (CapDAC) 225. CapDAC 225 may include a number of capacitors ($C_0$-$2^{N-1}C_0$) and control circuitry, such that a capacitance of CapDAC 225 may be changed in response to control signals during operation of CDC 210. CapDAC 225 nat also be referred to as a current DAC or just "DAC." Outputs of comparator 220 may be coupled to logic 230, which may be coupled to binary counter 240. In other embodiments, counters may be used that are not binary. The output (Data) of binary counter 240 may be coupled to an input of AND gate 245 for control of CapDAC 225 if a reset signal (Rst) is not asserted. The values of CapDAC 225 and the capacitance of the sensing electrode, $C_S$, may yield a signal, $V_S$, on the input of comparator 220. $V_S$ may be given by:

$$V_S = \frac{D*C_0}{C_S + (2^N - 1)*C_0} * V_{dd} = \frac{D*C_0}{C_S * C_{DAC}} * V_{dd},$$

where D is the digital code (Data) provided by the binary counter, $C_0$ is the least significant bit (LSB) capacitor, $C_{DAC}$ is the total capacitance of CapDAC 225, and $C_S$ is the capacitance of sensing electrode 201.

FIG. 3A illustrates a method 301 for operating CDC 210. Logic 230 first increments binary counter 240 in step 310, which increases the value of CapDAC 225 on the input of comparator 220. This increases the signal, $V_S$, on the input of comparator 220. $V_S$ is compared to $V_{REF}$ in step 315. If $V_S$ is not equal to or greater than $V_{REF}$, binary counter 240 is incremented again in step 310 and the comparison is repeated. If $V_S$ is equal to or greater than $V_{REF}$, binary counter 240 is decremented in step 320. If $V_S$ toggles about $V_{REF}$ for a prescribed number of cycles such that a toggle condition is detected in step 325, the binary counter code is stored in step 330. If not, the increment/decrement process continues until a toggle condition about $V_{REF}$ is detected and the counter value is stored in step 330.

FIG. 3B illustrates a method 302 for detecting the presence or proximity of a conductive object to sensing electrode 201. First, the stored value from step 330 of method 301 is loaded into binary counter 240 in step 340. If $V_S$ is not greater or equal to $V_{REF}$ in step 345, binary counter 240 is incremented in step 356 and the comparison is repeated. If $V_S$ is equal to or greater than $V_{REF}$, binary counter 240 is decremented in step 354 and the comparison is repeated as well. At each stage it is determined if the value of $V_S$ is toggling about $V_{REF}$ in step 355 (a toggle condition is reached). If the counter value upon determination that $V_S$ is toggling about $V_{REF}$ is the same as the stored value from step 330 of method 300, no capacitance change is detected in steps 365 and 370. If the change in the binary counter value is greater than a threshold value in step 375, a conductive object is detected on or in proximity to the sensing electrode in step 380. If the binary counter value is not greater than the threshold in step 375, than no conductive object is detected on or in proximity to the sensing electrode in step 390. In various embodiments, the newly determined counter value detected after the toggle is detected in step 355 may be stored and replace the counter value stored in step 330 of method 300. The method of FIG. 3B may sore the binary counter value after each conversion, such that CDC 210 is loaded with the previous binary counter value for the start of each conversion.

Figure 4:
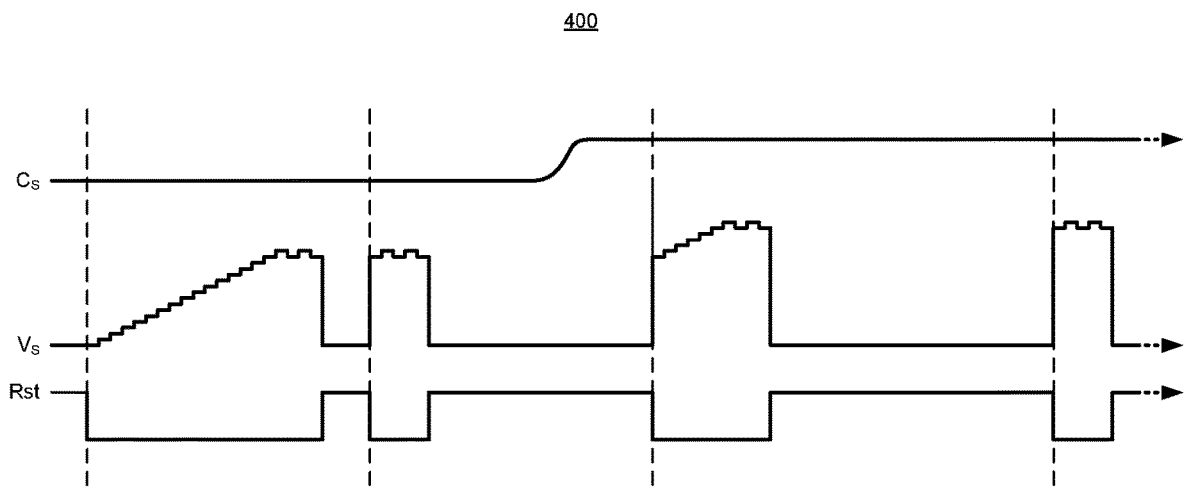
FIG. 4 illustrates capacitances and signal values corresponding to a single-ended asynchronous capacitance-to-digital conversion, according to one embodiment.

FIG. 4 illustrates a plot 400 of the signal, $V_S$, on the input of comparator 220 during operation of CDC 210. After the reset signal, Rst, is asserted, $V_S$ is incremented through successive operation of the comparator and the binary counter incrementing or decrementing. Once $V_S$ reaches $V_{REF}$, the binary counter is decremented and incremented as $V_S$ toggles about $V_{REF}$. After a certain number of cycles wherein the $V_S$ toggles about $V_{REF}$, the value of the binary counter is stored. In the plot of FIG. 4, once $V_S$ has toggled about $V_{REF}$ four times, the value of the binary counter is stored. While four toggles are illustrated, one of ordinary skill in the art would understand that more or fewer toggles could be used. Fewer toggles may result in faster response, but more toggles will result in better hysteretic control. As stated about, the binary counter value of the previous conversion may be loaded at the start of each conversion. In another embodiment, if a sensor is active (a conductive object is determined to be on or in proximity to the sensing electrode), storing of the binary count value may be suspended to ensure that the conductive object is detected on successive conversion cycles as long as it remains in contact with of proximity to the sensing electrode.

In one embodiment, the CDC 210 may be used to quantize the sensor capacitance. After a conversion cycle, $C_S$ may be given by:

$$C_S = D_{out} * 2 * C_0 - C_{DAC}$$

Figure 5A:
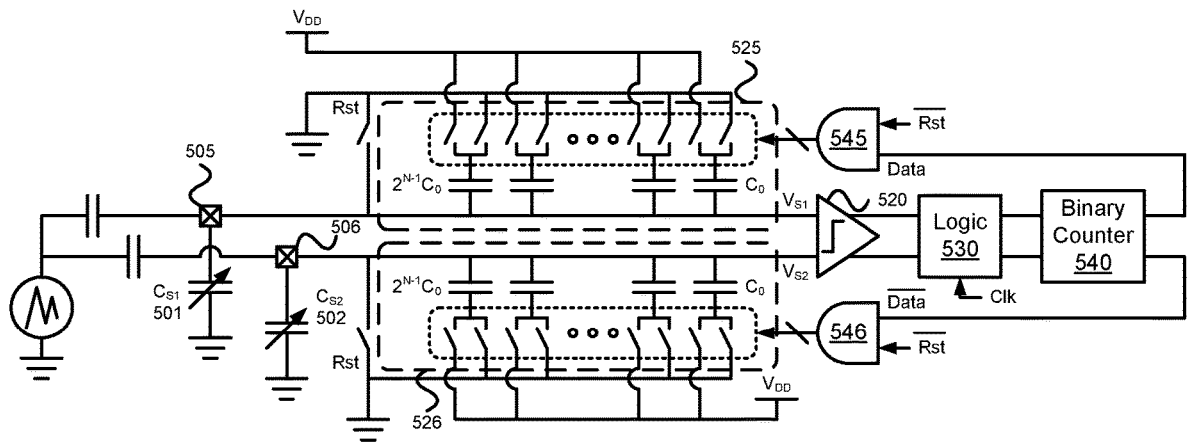
FIG. 5A illustrates a differential asynchronous CDC, according to one embodiment.

FIG. 5A illustrates a differential architecture for a CDC 500 creating a differential asynchronous CDC. Two sensing electrodes 501 and 502 may be coupled to inputs of comparator 520 through IOs 505 and 506, respectively. In one embodiment, one of the electrodes may be a dummy electrode or a fixed capacitance that is positioned such that its capacitance does not change in proximity to a conductive object (such as a finger). CapDACs 525 and 526 may be coupled to the inputs corresponding to sensing electrodes 501 and 502 and operate similar to CapDAC 225 of FIG. 2. CapDAC 525 may be controlled by a data signal (Data) from binary counter 540, while CapDAC 526 may be controlled by a Data_bar signal from binary counter 540. Data_bar may be a complimentary signal to Data, such that the signal added to the inputs of comparator 540 corresponding to sensing electrodes 501 and 502 are opposite.

Logic 530 coupled to the output of comparator 540 may form a feedback loop, such that the incrementing and decrementing of the binary counter 540 forces the signal on the comparator input corresponding to sensing electrode 501 ($V_{S1}$) to equal the signal on the comparator input corresponding to sensing electrode 502 ($V_{S2}$). $V_{S1}$ and $V_{S2}$ are then equal only at the midcode of binary counter 540. If there is a non-zero change in capacitance, the counter code deviates from its midcode by a value proportional to the change in capacitance. This relationship may be given by:

$$\Delta C = D_{out}\left[2C_0\left(1 + \frac{C_S}{C_{DAC}}\right)\right] - (C_{DAC} + C_S),$$

where $D_{OUT}$ is the output of binary counter 540. $D_{OUT}$ may is represented as "Data" in FIG. 5A.

The absolute value of the capacitance change may be derived linearly from the value of the LSB of CapDACs 525 and 526 by:

$$LSB = 2C_0\left(1 + \frac{C_S}{C_{DAC}}\right)$$

The linearity holds with fully differential signals, $+/-\Delta C$, superimposed on the baseline capacitance of both sensors. That is, the capacitance change ($\Delta C$) on both sensing electrodes is identical. This is infrequent. In many systems the capacitance change from a conductive object in contact with or in proximity to a sensing electrode is greater on one sensing electrode than it is on another. If only buttons are used, the capacitance change may only be present on a single sensing electrode. And if multiple sensing electrodes have conductive objects present on or near them, the physics of each sensing electrode and its environment make it unlikely that the ideal case (perfect linearity) is achieved.

Figure 5B:
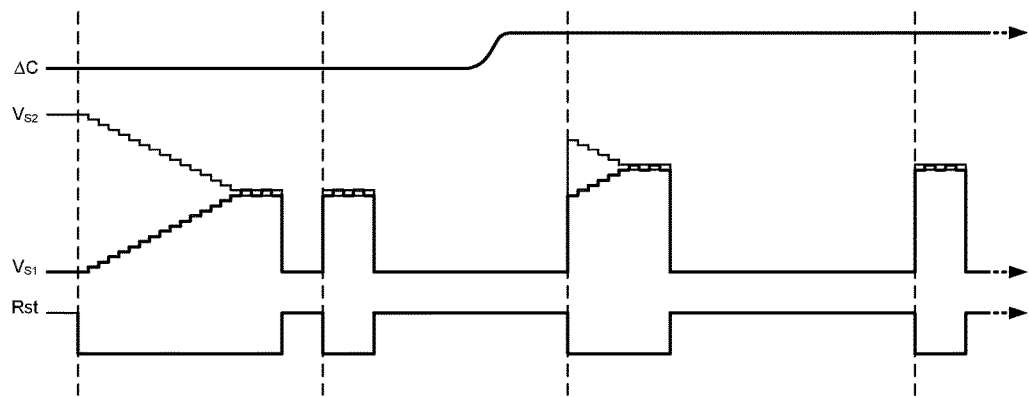
FIG. 5B illustrates capacitances and signal values corresponding to a differential asynchronous capacitance-to-digital conversion, according to one embodiment.

FIG. 5B illustrates capacitance and the resultant signals on differential electrodes 501 and 502. After the Rst signal is asserted, voltage, $V_{S1}$, increases on an input of comparator 520 and $C_{S1}$. Voltage $V_{S2}$ increases on the other input of comparator 520 and $C_{S2}$. Each signal toggles (reaches a toggle condition) and the binary counter value is stored. If capacitance does not change, the toggle condition is detected right away. If capacitance does change, $V_{S1}$ and VS2 are incremented/decremented until the toggle condition is reached again and the binary counter value is stored to for subsequent conversions.

Figure 6A:
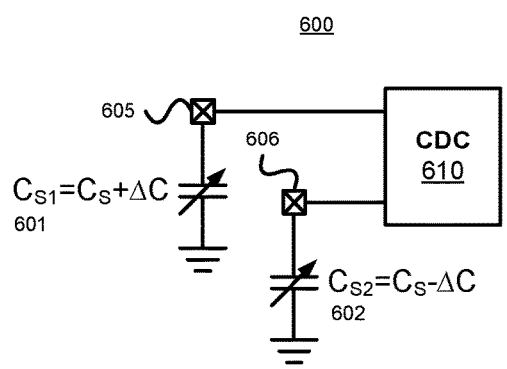
FIG. 6A illustrates capacitances of a differential capacitance-to-digital conversion, according to one embodiment.
Figure 6B:
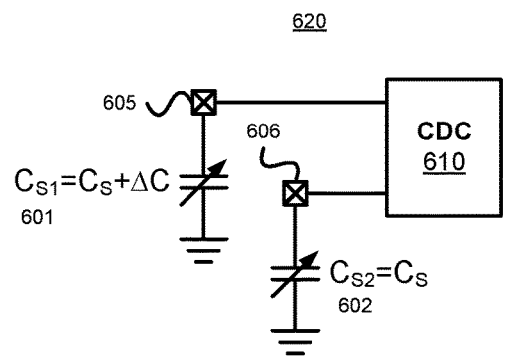
FIG. 6B illustrates capacitances of a pseudo-differential capacitance-to-digital conversion, according to one embodiment.

In cases where capacitance changes only for a single sensing electrode, the CDC may operate in a pseudo-differential mode, making the CDC nonlinear. However, the nonlinearity may be negligible when the capacitance change on the sensing electrode is small relative to the total capacitance of the CapDAC. FIGS. 6A and 6B illustrate the differences in capacitances measured in differential mode and pseudo-differential mode.

FIG. 6A illustrates a differential measurement 600 by CDC 610, where both sensing electrodes 601 and 602 coupled to inputs 605 and 605, respectively, have their capacitances changed by $\Delta C$, but in opposite directions such that:

$$\frac{\Delta C}{D_{out}} \propto 2C_0\left(1 + \frac{C_S}{C_{DAC}}\right).$$

FIG. 6B illustrates a pseudo-differential measurement 620 of CDC 620, where only a single sensing electrode 601 coupled to input 605 has its capacitance changed by $\Delta C$. The capacitance of sensing electrode 602 coupled to CDC 610 through input 606, remains constant. The change in capacitance can therefore be given by:

$$\frac{\Delta C}{D_{out}} \propto 2C_0\left(1 + \frac{C_S}{C_{DAC}} + \frac{\Delta C}{2C_{DAC}}\right).$$

As $\Delta C$ is much smaller than the value of the CapDAC ($C_{DAC}$), there is little noticeable change in the performance of the CDC when operating in pseudo-differential mode. In other embodiments, both capacitances may change, but the $\Delta C$ applied to each capacitance is different. In this case, the pseudo-differential operation may be applied.

Figure 7:
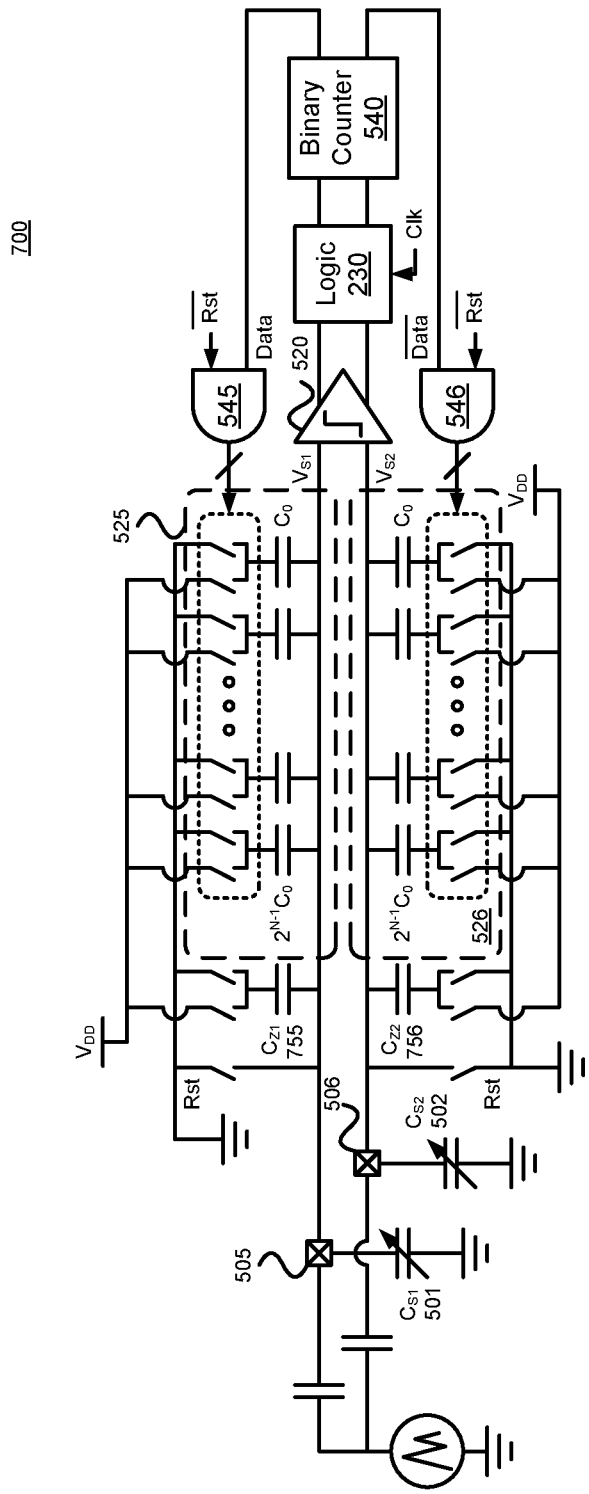
FIG. 7 illustrates a differential asynchronous CDC including a zoom capacitor, according to one embodiment.

When the value of the baseline or parasitic capacitance is high, it may take too long to charge up/down the capacitor to the comparator midcode. In this case, a zoom capacitor may be used to provide a step voltage signal on the sensing electrodes. FIG. 7 illustrates a CDC 700 with zoom capacitors 755 and 756 coupled to sensing electrodes 501 and 502, respectively. The capacitance, $C_Z$, of the zoom capacitor may be used to increase the common mode voltage at the input of comparator 520. This may ensure that the values of $V_{S1}$ and $V_{S2}$ remain in the common-mode range of comparator 520, even if the parasitic or baseline capacitance of the sensing electrodes is high. The effect of the zoom capacitance on the signals on the inputs of the comparator may be given by:

$$V_{S1} = \frac{C_Z + D_{out}C_0}{C_Z + C_{DAC} + C_S + \Delta C} V_{dd}$$

$$V_{S2} = \frac{C_Z + \overline{D_{out}}C_0}{C_Z + C_{DAC} + C_S - \Delta C} V_{dd}$$

The use of a zoom capacitor may also improve the resolution of the conversion. Using the zoom capacitor may obviate the use of some of the bits of CapDACs 525 and 526 by skipping the increment/decrementing of the code associated with the greater capacitances necessary to reach the comparator's midcode. The improvement to the resolution of the conversion may be seen by:

$$\frac{\Delta C}{D_{out}} \propto 2C_0 * \left(1 + \frac{C_S + \frac{C_{DAC}}{2}}{C_Z + \frac{C_{DAC}}{2}}\right).$$

The actual change in voltage (signal) on the comparator inputs is therefore given by:

$$\Delta V = \frac{C_0}{C_S + C_Z + C_{DAC}}.$$

For clarification, a zoom capacitor may compensate for common mode capacitance (capacitance that exists on both sensing electrodes), while the CapDAC is used to convert the differential capacitance to a digital value (the counter value) and is controlled by the counter output.

Further Power Optimization

Because more power is required for midcode transitions than is required for LSB transitions of the CapDAC, a coarse/fine operation may be employed to allow for a greater range of LSB transitions before a midcode transition is required. That is, a coarse/fine scan operation may reduce the frequency at which a small capacitance change on a sensing electrode causes a midcode transition. The CapDAC may be split into a 4-bit coarse CapDAC and a 6-bit fine CapDAC. The 6-bit fine CapDAC may have a range equivalent to two coarse CapDAC LSBs. In various other embodiments, different resolutions of coarse and fine CapDACs may be used.

Figure 8A:
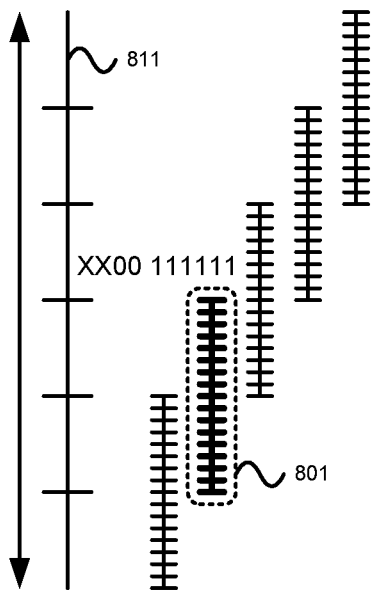
FIGS. 8A-B illustrate a coarse/fine binary counter scheme, according to one embodiment.
Figure 8B:
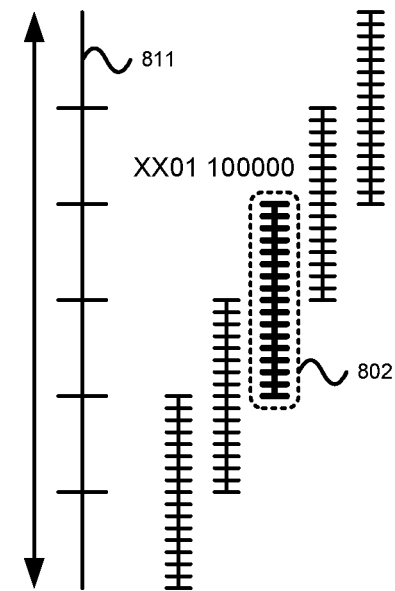

FIGS. 8A and 8B illustrate embodiments of coarse and fine operation. FIG. 8A illustrates a fine CapDAC 801 with a range of two LSBs of a coarse CapDAC centered on the second bit of the coarse CapDAC 811. The fine CapDAC is at its highest value when all bits of the fine CapDAC high. To move to the next level, illustrated in FIG. 8B, then the coarse CapDAC 811 is incremented, and the fine CapDAC 802 is set to its midcode. Using this coarse/fine overlap may reduce the maximum switching losses from the CapDAC by 16*x*. Fine CapDACs may have greater overlap with coarse CapDACs in some embodiments, such that a fine CapDAC overlaps three bits of a coarse CapDAC.

Figure 9:
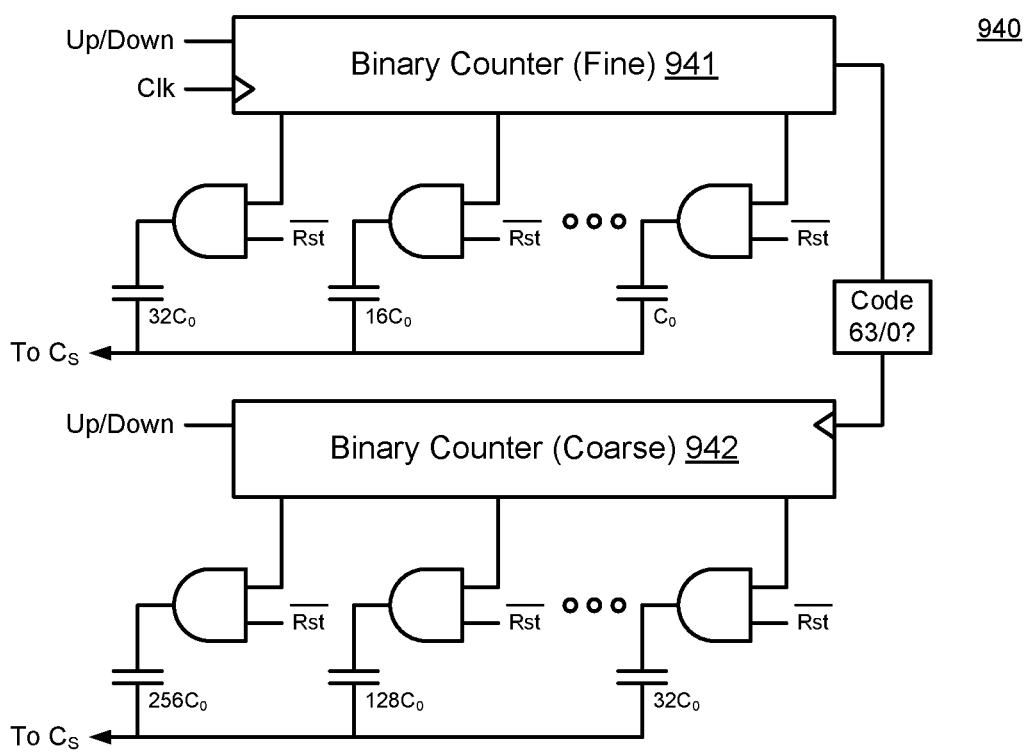
FIG. 9 illustrates a combined coarse/fine binary counter, according to one embodiment.

To realize the coarse/fine operation described above, separate linked binary counters for the coarse CapDAC and the fine CapDAC may be implemented. FIG. 9 illustrates a combined binary counter 940 for the coarse and fine CapDACs. Fine Binary Counter 941 may have a control signal ("Up/Down") for incrementing or decrementing the counter value and a clock input ("Clk") to enable the increment/decrement. Incrementing or decrementing fine binary counter 941 increases or decreases the CapDAC value by one LSB (Co) until the code from the fine binary counter is 63 or 0 and the CapDAC value is therefore 63C₀ or 0. When this occurs, the coarse binary counter 942 may by incremented or decremented by receiving the up/down signal and having an enabled input from fine binary counter 941. If the fine binary counter 941 has a value of 63 or 0, meaning that it is saturated or completely off, the coarse binary counter 942 may be incremented or decremented and the fine binary counter 941 reset to its midcode. That is, the fine binary counter's MSB is set to 1 and the rest of the bits are set two zero.

Table 1 illustrates the binary counter increasing about the coarse and fine binary counters.

TABLE 1

| Time | 4-bit Coarse | | | | 6-bit Fine | | | | | | CapDAC |
|---|---|---|---|---|---|---|---|---|---|---|---|
| 1 | 0 | 0 | 1 | 0 | 1 | 1 | 1 | 1 | 1 | 0 | 126C₀ |
| 2 | 0 | 0 | 1 | 0 | 1 | 1 | 1 | 1 | 1 | 1 | 127C₀ |
| 3 | 0 | 0 | 1 | 1 | 1 | 0 | 0 | 0 | 0 | 0 | 128C₀ |

When the objective is low-power operation, other system components should also be optimized for power consumption. Rather than implement a high-frequency clock, which may consume more power than is necessary, the CDC of the present invention may employ an asynchronous logic loop for the counter and the comparator.

Figure 10A:
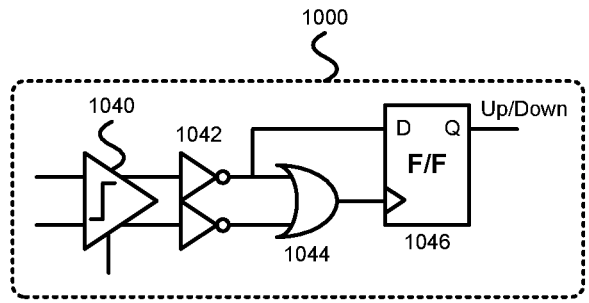
FIG. 10A illustrates an edge detector, according to one embodiment.

FIG. 10A illustrates an embodiment of an edge detector 1000 including comparator 1040 with differential inputs and outputs. Differential outputs are coupled to inverters 1042, which are in turn coupled to OR gate 1044. The output of one of the inverters is provided to the D input of flip-flop (F/F) 1046. The output of OR gate 1040 is coupled to the clock of the F/F, which may provide the up/down (increment/decrement) signal to the CapDAC.

Figure 10B:
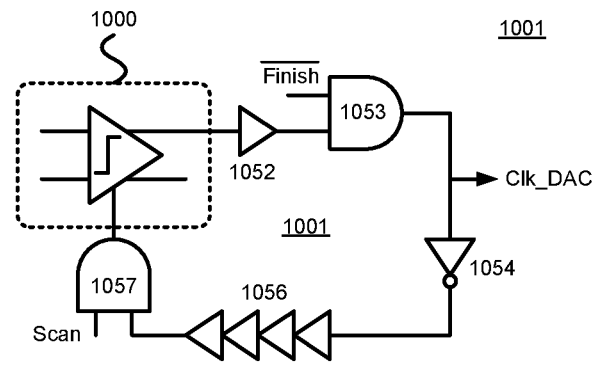
FIG. 10B illustrates an oscillation loop for use with the asynchronous CDC, according to one embodiment.

FIG. 10B illustrates an oscillation loop 1001 including the edge detector 1000 of FIG. 10A coupled to a first buffer 1052 (Delay 1), the output of which is coupled to AND gate 1053. When a Finish signal is not asserted (see FIG. 10C, below), a clock signal is provided to the CapDAC (as shown in FIG. 9). The output of the AND gate 1053 is inverted by inverter 1054 and delayed again through a second buffer 1056 (Delay 2). In one embodiment, the second delay by the second buffer 1056 may be a number of cascaded buffers. In the embodiment of FIG. 10B, four buffers are used. One of ordinary skill in the art would understand that more or fewer buffers may be implemented depending on the desired delay. In another embodiment, delays may be programmable to adjust to various system and timing requirements. More or fewer buffers may be used based on program settings. The output of the second delay is input to AND gate 1057 with a scan signal from a low-frequency clock (see FIG. 11, below). If the scan signal is asserted and the output of the second delay is high, a control signal is provided to comparator 1040 of edge detector 1000 and the comparison of the signals on the comparator inputs is executed again. This starts the oscillation loop again.

Figure 10C:
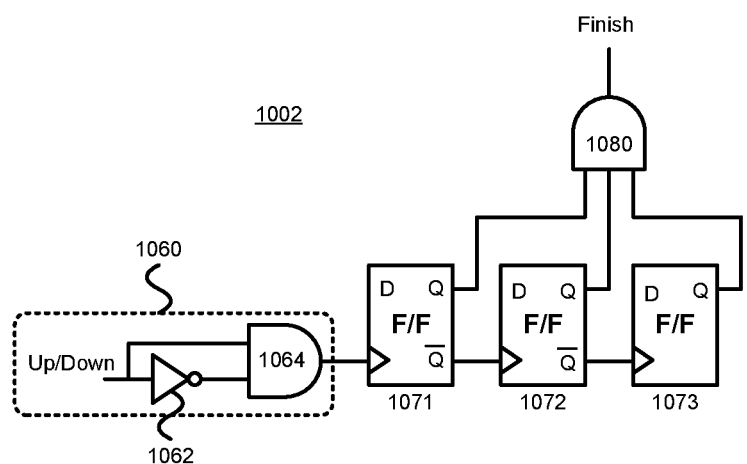
FIG. 10C illustrates Finish logic for use in determining the completion of a conversion by the asynchronous CDC, according to one embodiment.

FIG. 10C illustrates a circuit 1002 for generating the Finish signal on AND gate 1053 of the oscillation loop 1001 of FIG. 10B. An edge generator 1060 receives the up/down signal from the F/F 1046 of edge detector 1000 (from FIG.

10A). This signal is inverted by inverter 1062 and input with the same signal to an AND gate 1064. The delay of the inverter 1062 generates a pulse that clocks the first F/F 1071. Two additional F/Fs, 1072 and 1073, are coupled in series, with their Q outputs coupled to an input of an AND gate 1080. When all three F/Fs output a high, a Finish signal is asserted and the clock signal for the CapDAC (see FIG. 10B) is stopped.

Figure 11A:
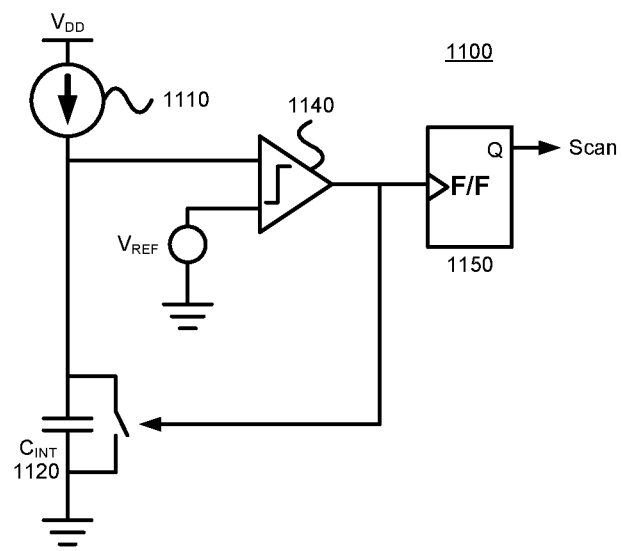
FIG. 11A illustrates a low-frequency relaxation oscillator for the asynchronous CDC, according to one embodiment.

Further power savings may be achieved by the use of a low-frequency clock. FIG. 11A illustrates a low-power relaxation oscillator 1100 acting as the low-frequency clock. A current source 1110 is provided to an integration capacitor, $C_{INT}$ 1120, which ramps the voltage across the integration capacitor at a rate of $$\text{Rate} = \frac{I_{ref}}{C_{int}}$$

Continuous time comparator 1140 may reset the integration capacitor every time the voltage, $V_{INT}$, across the integration capacitor crosses $V_{REF}$. The output of comparator 1140 is coupled to F/F 1150, which outputs the scan signal to the CDC (see the input of AND gate 1057 of FIG. 10B).

Figure 11B:
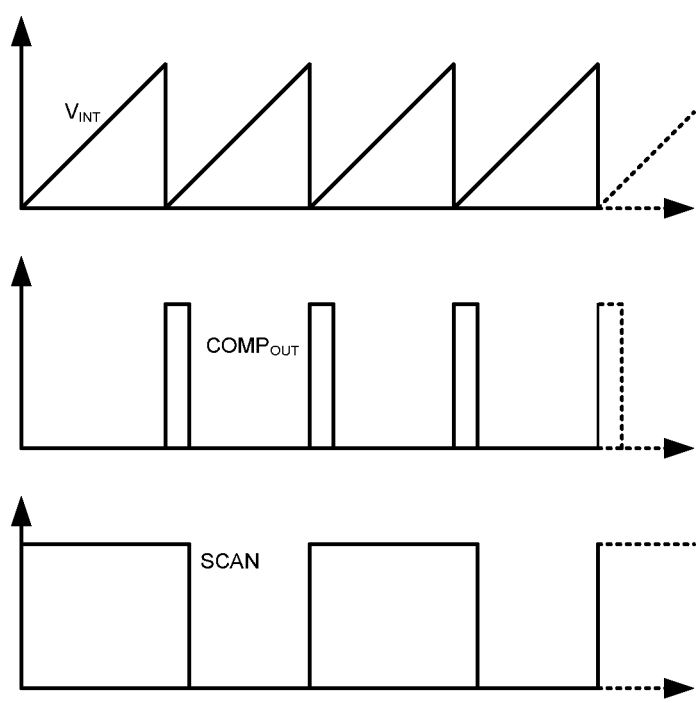
FIG. 11B illustrates waveforms and signals corresponding to the low-frequency relaxation oscillator for the asynchronous CDC, according to one embodiment.

FIG. 11B illustrates waveforms for the various voltage signals and outputs of low-power relaxation oscillator 1100. $V_{INT}$ is increased at the rate of $I_{REF}/C_{INT}$ and is reset when it reaches $V_{REF}$. The output of comparator, $V_{OUT}$, is high with each crossing of $V_{INT}$ of $V_{REF}$. The scan signal is changed at each comparator output pulse. The period of the low-power relaxation oscillator may be given by $$T_{period} = \frac{V_{ref}}{I_{ref}} C_{int} \;\&\&\; T_d \ll T_{period},$$

where $T_d$ is the comparator delay, $T_{period}$ is the oscillation period, and $V_{REF}$ and $I_{REF}$ are the reference voltage and reference current, respectively. A F/F may be added to the output of the comparator to 50% by dividing the frequency of the comparator by 2.

Figure 12:
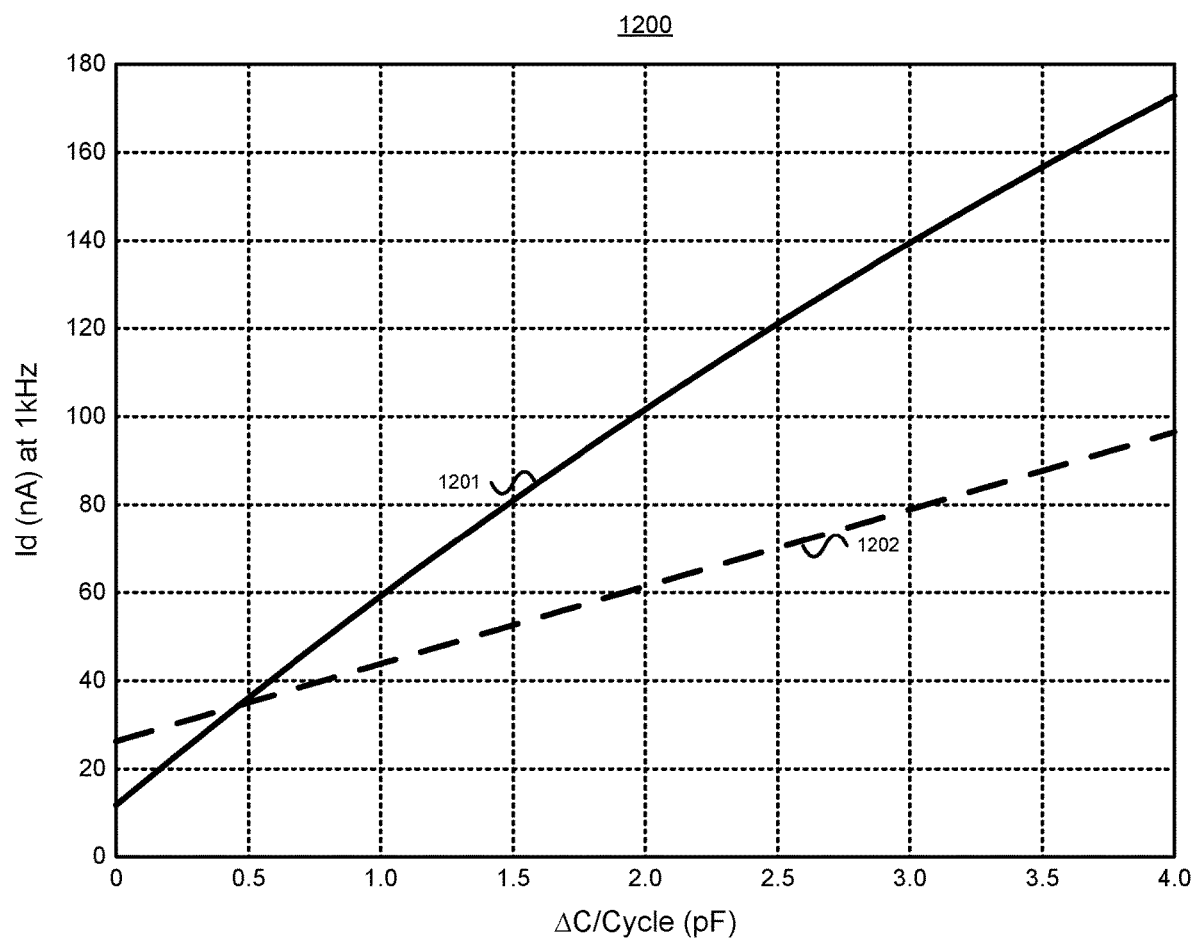
FIG. 12 illustrates power consumption in the analog and digital domains of the asynchronous CDC.

FIG. 12 illustrates a graph 1200 of current consumption for analog and digital circuitry of the CDC. When the CDC detects no change in capacitance (no conductive object is on or proximate to the sensing electrodes. The analog power consumption 1201 is approximately 25 nA at a low clock frequency (1 kHz). The digital power consumption 1202 for the digital portions of the circuit is less than 20 nA. As the change in capacitance increases, the analog power consumption 1201 and the digital power consumption 1202 increase. However, a sensing device spends most of its life in an idle state, where capacitance has not changed. The quiescent power can therefore be the dominant factor in the overall power consumption of a capacitance sensing system. Power consumption that is proportionate to the capacitance change can vastly increase battery life for devices that are not connected to mains power.

It will further be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A capacitance-to-digital converter (CDC) comprising:
    a comparator having a first input coupled to a first sensing electrode and a second input coupled to a second sensing electrode;
    a first capacitive digital-to-analog converter (DAC) coupled to the first input of the comparator, the capacitive DAC for applying a first signal to the first sensing electrode;
    a second capacitive digital-to-analog converter (DAC) coupled to the second input of the comparator, the capacitive DAC for applying a second signal to the second sensing electrode; and
    a counter for providing control signals to the first and second capacitive DACs, the counter receiving logic signals from a logic unit coupled to an output of the comparator,
    wherein a first counter value corresponding to the control signal provided to the first capacitive DAC from a first counter output and a second counter value corresponding to the control signal provided to the second capacitive DAC from a second counter output are in response to a capacitance on at least the first sensing electrode coupled to the first input of the comparator, and
    wherein the logic unit comprises:
        a first inverter coupled between a first output of the comparator and a first input of an OR gate,
        a second inverter coupled between a second output of the comparator and a second input of the OR gate, and
        a D flip-flop (F/F) coupled to the first input of the OR gate and the output of the OR gate, the D F/F for providing increment or decrement signals to the counter.

2. The CDC of claim 1, wherein a first control signal to the first capacitive DAC from the counter is complimentary to a second control signal to the second capacitive DAC from the counter.

3. The CDC of claim 1, wherein the logic unit determines whether to increment or decrement the counter.

4. The CDC of claim 1, wherein the first and second capacitive DACs each comprises a coarse capacitive DAC and a fine capacitive DAC coupled to the output of the counter.

5. The CDC of claim 4, wherein the coarse capacitive DACs comprise a first set of DAC values and the fine capacitive DACs comprises a second set of DAC values, and wherein the first set of DAC values and the second set of DAC values have at least one overlapping value.

6. The CDC of claim 1 further comprising a first zoom capacitor coupled to the first input of the comparator and a second zoom capacitor coupled to the second input of the comparator, the first and second zoom capacitors for applying first and second step signals onto the first and second inputs of the comparator.

* * * * *